United States Patent [19]

Sepponen

[11] Patent Number: 4,769,604

[45] Date of Patent: Sep. 6, 1988

[54] METHOD OF MAPPING THE MATERIAL PROPERTIES OF AN OBJECT TO BE EXAMINED

[75] Inventor: Raimo Sepponen, Helsinki, Finland

[73] Assignee: Instrumentarium Corp., Finland

[21] Appl. No.: 38,475

[22] Filed: Apr. 14, 1987

Related U.S. Application Data

[63] Continuation of Ser. No. 794,487, Nov. 4, 1985, abandoned.

[30] Foreign Application Priority Data

Dec. 20, 1984 [FI] Finland ................................. 845049

[51] Int. Cl.$^4$ ............................................. G01R 33/20
[52] U.S. Cl. ..................................... 324/311; 324/309
[58] Field of Search ............... 324/300, 306, 307, 309, 324/311, 314; 128/653; 436/173

[56] References Cited

U.S. PATENT DOCUMENTS

| | | | |
|---|---|---|---|
| 3,753,081 | 8/1973 | Freeman | 324/311 |
| 4,068,161 | 1/1978 | Ernst | 324/311 |
| 4,510,449 | 4/1985 | Ernst et al. | 324/311 |
| 4,536,712 | 8/1985 | Iwaoka et al. | 324/309 |

FOREIGN PATENT DOCUMENTS

| | | | |
|---|---|---|---|
| 2109558 | 6/1983 | United Kingdom | 324/307 |
| 0649995 | 4/1979 | U.S.S.R. | 324/311 |

Primary Examiner—Stewart J. Levy
Assistant Examiner—Kevin D. O'Shea
Attorney, Agent, or Firm—Andrus, Sceales, Starke & Sawall

[57] ABSTRACT

A method of mapping the local distribution of the coupling constant J and for the application of this method, as for example, for examining the dynamic properties of an object. The object is excited with a first (90°) excitation pulse. A magnetic field gradient is applied to the object and after a first time delay, the object is subjected to a second (180°) excitation pulse. A magnetic field gradient is reapplied and after a second time delay, the spin echo signal is obtained. The sequence is repeated by changing the first and second delay times and changing the time integrals of the magnetic field gradients in accordance with the selected NMR imaging method. The second excitation pulse is preferably maintained at the midway point of the time between the first excitation pulse and the spin echo. The method may be used to analyze metabolic or physiological properties by using tracers with nuclei having coupling constants differing from the nuclei normally present in the object.

9 Claims, 5 Drawing Sheets

METHOD OF MAPPING THE MATERIAL PROPERTIES OF AN OBJECT TO BE EXAMINED

The present application is a continuation application of U.S. patent application Ser. No. 794,487 filed Nov. 4, 1985, and now abandoned.

The present invention relates to a method of determining the local distribution of the coupling constant J of the nucleus of an atom to be examined in a three-dimensional object, e.g. a human body or trunk of a tree. The method can be applied e.g. to mapping and analysing the metabolism of an object, the flow occurring in an object and other dynamic properties by using as a tracer or indicator an ingredient having a specific coupling constant.

The existence of nuclear magnetic resonance phenomenon (NMR phenomenon) was established experimentally in 1946 by two research groups (Pound, Purcell, Torrey and Bloch, Hansen, Packard). This discovery quickly led to wide application of the phenomenon in the fields of physics and organic chemistry.

BACKGROUND OF THE INVENTION

All nuclei with odd number of protons or neutrons have an impulse moment or spin different from zero. The nuclei also have a positive electric charge which, together with the spin of the nucleus, produces for the nucleus a magnetic moment whose direction coincides with that of the spin axis of the nucleus. A field generated by the magnetic moment of a nucleus can be approximated by the field of a magnetic dipole. If a sample containing a plurality of nuclei is placed in a static magnetic field, the magnetic moments of the nuclei tend to align parallel with an external magnetic field and the sample will be provided with a net magnetization parallel to the external magnetic field. The order of net magnetization is proportional to the number of nuclei in a sample and to the strength of an external magnetic field. The orientation of nuclei is disturbed by the thermal motion of nuclei, so the order of magnetization will also be affected by the temperature of a sample. As temperature increases, magnetization decreases. In terms of quantum mechanics, the events can be described so that an external magnetic field generates a number of energy levels depending on the spin quantum number (I) of a nucleus, at which levels a nucleus can set with a certain probability. The nucleus of a hydrogen atom or proton has a spin quantum number $I=\frac{1}{2}$, so a proton can settle at two energy levels either in a manner that the direction of its magnetic moment is the same as that of the external magnetic field or reverse to this direction. Of these two, the former is more probable and the occupation proportions of energy levels conform with the so-called Boltzmann distribution.

In order to move from one energy level to another, a nucleus either receives or delivers an energy quantum as electromagnetic radiation of a certain frequency. The radiation frequency is determined by the difference between energy levels, which is directly proportional to the strength of an external magnetic field. This frequency, which is associated with the exchange of energy, is called the Larmor frequency and this exchange of energy between nucleus and environment is called the nuclear magnetic resonance phenomenon. The principles of nuclear magnetic resonance have been described e.g. in the following references: Abragam A.; The Principles of Nuclear Magnetism. London Oxford University Press., 1961 and Slichter C. P.; Principles of Magnetic Resonance, Berlin, Springer Verlag, 1981.

The nuclear magnetic resonance phenonmenon has been studied by so-called continuous radiation (CW, Continuous Wave) and pulse methods. Pulse methods have been found more effective than CW-methods and are thus employed in NMR-spectroscopy and so-called nuclear spin imaging.

In pulse methods, a sample is subjected to an electromagnetic pulse of Larmor frequency, whose duration is determined in a manner that the nuclear magnetization of a sample spins through a desired angle ($\theta$) with respect to the direction of an external magnetic field. The amplitude and duration of an electromagnetic pulse are generally selected in a manner that ($\theta$) is a multiplex of 90°. Generally used terms are 90°- and 180°-pulses etc. After the act of excitation, the net magnetization $M_n$ deflected from the direction of a basic magnetic field $B_o$ precesses at the Larmor frequency $W_o$ around the direction of $B_o$. This can be established by placing a coil outside a sample in a manner that its magnetic axis is orthogonal to the direction of $B_o$. The precessing net magnetization induces in the coil a so-called FID-signal (Free Induction Decay), which has Larmor frequency and whose amplitude is proportional to the strength of the nuclear magnetization of a sample or the number of nuclei and to the strength of an external magnetic field.

The pulse methods involved in nuclear magnetic resonance tests have been described e.g. in the following references: Farrar T. C., Becker E. D.; Pulse and Fourier Transform NMR—Introduction to Theory and Methods. New York, Academic Press, 1971 and Ernst R. R., Anderson W. A.; Application of Fourier Spectroscopy to Magnetic Resonance, Rev Sci Instrum, Vol. 37, No. 1, 1966. Particularly, the biological applications of NMR are described in the reference Gadian D. G.; Nuclear magnetic resonance and its applications to living systems, Oxford University Press, Oxford 1984.

During the excitation, a nuclear system receives external energy from an exciting radio frequency field, and after the excitation, delivers it to its environment. The delivery of energy can occur as coherent radiation that can be detected by means of an external coil or energy can be transferred into the structure of a sample as thermal motion. In connection with the delivery of energy, the net magnetization of a sample returns to its rest value. The nature of this process is exponential and characterized by a relaxation time $T_1$. This relaxation time is dependent on the composition of a substance to be examined, e.g. with liquid substances $T_1$ is relatively short (milliseconds to seconds), while with solid substances $T_1$ is long (minutes to weeks).

The coherence of radiation emitted by a sample declines after excitation at a rate determined e.g. by the properties of a substance to be examined and the homogeneity of an external magnetic field. This results in exponential decay of a signal at a rate characterized by a relaxation time $T_2^*$ ($T_2$ asterisk).

$$1/T_2^* = 1/T_2 + \gamma \Delta B_o/(2\pi), \tag{1}$$

wherein
$T_2$ is the spin-spin relaxation time of a sample
$\gamma$ is a gyromagnetic ratio
$\Delta B_o$ is the inhomogeneity of a polarizing magnetic field over a sample.

All above relaxation times are dependent on the immediate environment of nuclei and its activity. As pointed out above, the physical state of a sample has an effect on relaxation times but also the strength of an external magnetic field and temperature of a sample change relaxation times.

The usefulness of the nucleus of a hydrogen atom or the proton in medical diagnostics is based on the abundance of hydrogen in soft tissues, in which it is primarily bound to water molecules. By virtue of its polarity, in turn, a water molecule links itself in various ways to different protein chains and this linkage is altered for a plurality of reasons, e.g. due to a pathological process directed at a tissue.

Relaxation times and their alterations have been dealt with e.g. in the following references:

R. Damadian U.S. Pat. No. 3,789,832 and Nuclear Magnetic Resonance of Intact Biological Systems, Phil Trans R Soc Lond, 289, June 1980, R. Mathur de Vré; Progress in Biophysics and Molecular Biology, Vol. 35, 103–104, 1979.

Interest in utilizing NMR phenomenon in medicine rose in the early 1970s. That was when R. Damadian published the research results, revealing that the relaxation time $T_1$ of a malignant tumour tissue is even twice as long as that of a corresponding normal tissue. The publication R. Damadian U.S. Pat. No. 3,789,832 discloses a method for identification of a malignant tumour tissue by comparing the measured relaxation of a tissue with tabulated relaxation time values and then diagnosing possible malignancy of a specimen.

However, later studies have indicated that the changing of relaxation times is not specific of any particular pathological condition. It can be generally concluded, however, that relaxation times change readily due to various ailments and can thus be applied in medical diagnostics.

The publication U.S. Pat. No. 3,789,832 also discloses a kind of scanning apparatus for the examination of a human body by means of NMR. However, this prior art solution cannot be regarded as any spin imaging apparatus. The basic idea of nuclear spin imaging was published by P. C. Lauterbur in 1973 in the reference P. C. Lauterbur; Nature, 242, 190, 1973. In this publication, he also brought up the idea of mapping a relaxation time $T_1$. Several pulse sequences have been developed for measuring relaxation times, including a so-called Saturation Recovery and Inversion Recovery sequences for measuring $T_1$ and Spin-Echo-sequence for measuring $T_2$. These sequences have been dealt with e.g. in the reference: Farrar T. C., Becker E. D.; Pulse and Fourier Transform NMR—Introduction to Theory and Methods, Academic Press, New York, 1971.

The nuclear spin imaging methods can be roughly classified in three categories: 1. Point scanning, 2. Line scanning and 3. Volume imaging methods. In point scanning techniques, an object area to be examined is mapped by moving the object or a point-like NMR sensitive area, obtained by various technical means, with respect to each other. The main disadvantage of single point techniques is that they are slow and, therefore, they are not applied in medical imaging. With special arrangements, however, the point scanning methods can be used to obtain more tissue information than with e.g. whole volume scanning methods. Single point scanning techniques have been described e.g. in references: Tanaka et al: Proc. IEEE, Vol. 66, No. 11, 1582–1583, 1978, Damadian: Offenlegungsschrift No. 2946847, Moore et al: U.S. Pat. No. 4,015,196, Abe: U.S. Pat. No. 3,932,805, Garroway et al: U.S. Pat. No. 4,021,726, Crooks et al: U.S. Pat. No. 4,318,043, Young: UK Patent Appln. GB No. 2122753 A.

By combining the slow single point scanning technique and rapid ultrasonic imaging technique, as set forth in the reference Sepponen; FI Pat. No. 64282, the single point scanning techniques can be utilized in medical diagnostics.

Line scanning techniques have been described e.g. in the following references: Moore et al: U.S. Pat. No. 4,016,196, Sepponen: FI Pat. No. 59868, Garroway et al: U.S. Pat. No. 4,021,196, Crooks et al: U.S. Pat. No. 4,318,043, Hutchison et al: U.S. Pat. No. 4,290,019. Line scanning methods are also too slow for medical imaging and, thus, their application is restricted to certain special cases.

Imaging of a three-dimensional object is most preferably effected by applying whole volume scanning techniques. By means of so-called selective excitation, it is possible to define an object area to be examined from an object and to effect more accurate mapping of the distribution of NMR parameters.

Selective excitation can be effected by switching over the object a magnetic field gradient orthogonal to the plane of an object area to be excited and by modulating an exciting radio-frequency pulse in a manner that its frequency band width and the gradient field strength correspond to the width of a desired object area. Another method of defining an object area is to utilize an oscillating magnetic field gradient, as set forth in reference Moore et al: U.S. Pat. No. 4,015,196. Prior known is also to utilize a gradient in an exciting radio-frequency pulse in a manner that, on successive times of excitations, the gradient direction is changed, a stable NMR signal being only generated in the plane where the pulse amplitude is constant.

A considerably more inaccurate method is to utilize the geometrical properties of transmitter and receiver coils for defining an object area and, thus, this method has only been applied when it is desired to effect NMR spectroscopic studies of the object. The application of this method has been described in references: Ackerman et al: Nature 283, 167, 1980, Haase et al: J. Magn. Reson. 56, 401–412, 1984, Bottomley et al: Radiology, 150, 441–446, 1984.

Whole volume imaging methods have been described e.g. in references: Lauterbur; Nature, 242, 190–191, 1973, Ernst; U.S. Pat. No. 4,070,611, Hutchison et al: International Patent Application WO No. 81/02788, Sepponen: FI Application No. 824343 corresponding to U.S. Pat. No. 4,654,595 of Mar. 31, 1987.

For speeding up the imaging, it is possible to apply methods disclosed in references: Edelstein et al: GB Application No. 2079463, Mansfield: U.S. Pat. No. 4,165,479, Hinshaw: Physics Letters 48A, No. 2, June 3, 87–88, 1974. Likes: U.S. Pat. No. 4,307,343.

Particularly noteworthy nuclear spin imaging methods are so-called Fourier imaging methods, one version of which has been set forth in the reference Ernst: U.S. Pat. No. 4,070,611. A drawback in this cited method is the collection of an FID signal generated after the excitation pulse. Encoded in the phase of a collected FID signal is the position information of one or two perpendicular directions by means of gradient pulses of constant amplitudes but varying durations. One of the drawbacks in this method is that the moment of collection or pick-up changes on various signal pick-up times, resulting in the method sensitivity to the inhomogeneities of a polarizing magnetic field $B_o$ and, thus, $T_2$ of a sample or specimen also affects the signal to be picked up.

The reference Hutchison et al: WO No. 81/02788 discloses a variation of Fourier imaging technique for generating a sort of spin echo by changing the magnetic field gradient direction. This spin echo is stored and encoded in its phase has been the position information by means of a gradient pulse orthogonal to the direction of a read-out gradient, the amplitude of said gradient pulse being changed on various repetition cycles. A more preferred way of generating a spin echo is to utilize a so-called 180° refocusing pulse which is capable of compensating the effect of the basic field inhomogeneities on a final image. Applications of this method have been described in references: Edelstein et al: EP No. 91008, Bottomley et al: EP No. 98426, Hutchison et al: Proceedings of 18th Ampere Congress, Nottingham, 1974, 283–284 and Sepponen: FI Application No. 824343.

The reference Brunner P. et al: Journal of Mag. Res. 33, 83–106 (1979) discloses how to speed up the examination of three-dimensional object with nuclear spin imaging techniques by directing the excitation and detection phases in temporal succession at various parts of an object. This serves to avoid a long duration of the examination caused by the nuclear system recovery time.

In fact, wider application of the NMR phenomenon was based on the discovery of a so-called chemical shift which was first published in the reference Proctor et al: Phys. Rev. Lett., Vol. 77, p. 717, 1950. A chemical shift is produced as the chemical linkage changes the electron sheath of a nucleus and hence also the external magnetic field "seen" by the nucleus. In fact, the NMR spectroscopy is at present one of the most important tools of chemical analysis. The reference Aue et al: Journal of Chem. Phys., vol. 64, 2229 ... 2246 describes the principle of so-called two-dimensional Fourier spectroscopy that facilitates the discovery of the fine structure of NMR spectrum. By means of this method, it is possible to study the order of so-called coupling constants. A coupling constant reflects the mutual interaction of two nuclei and is independent of the strength of an external magnetic field. The symbol of coupling constant is often J and its quality a quality of frequency, i.e. Herz (Hz). References Sukumar et al: J. Magn. Reson., vol. 50, 161 ... 164, 1982, Sepponen et al: J. Comput. Assist. Tomogr., vol. 8, 585 ... 587, 1984, Cox et al: J. Magn. Reson., vol. 40, 209 ... 212, 1980, Mansfield: Magn. Reson. in Medincine, vol. 1, 370 ... 386, 1984, Mansfield: EP No. 105700, Burl et al: GB No. 2057142A, Bottomley: FI 833219, Sepponen: FI No. 832326, Sepponen: FI No. 833807, Maudsley et al: Siemens Forsch.u. Entwickl.-Ber. Bd. 8, 326 ... 331, 1979, Bendel et al: J. Magn. Reson. Vol. 38, 343 ... 356, 1980 and Pykett et al: Radiology, vol. 149, 197 ... 201, 1983 disclose methods for finding out the local distribution of NMR spectrum but there is no knowledge of available methods for mapping the local distribution of a coupling constant J.

SUMMARY OF THE INVENTION

The object of the present invention is to provide a method of mapping the local distribution of the coupling constant J and for the application of this method, as for example, for examining the dynamic properties of an object.

In the mapping method, the object is excited with a first (90°) excitation pulse. A magnetic field gradient is applied to the object and after a first time delay, the object is subjected to a second (180°) excitation pulse. A magnetic field gradient is reapplied and after a second time delay, the spin echo signal is obtained.

The above sequence is repeated by changing the first and second delay times and changing the time integrals of the magnetic field gradients in accordance with the method selected for NMR imaging. The second excitation pulse is preferably maintained at the midway point of the time between the first excitation pulse and the spin echo.

The method may be used to analyze physiological properties such as respiration, digestion, blood circulation, or tumor location by using tracers with nuclei having coupling constants different from the corresponding nuclei normally present in the object.

DESCRIPTION OF THE DRAWING

The invention is illustrated in the accompanying drawings, in which.

DESCRIPTION OF THE ILLUSTRATED EMBODIMENT

Figure 1:
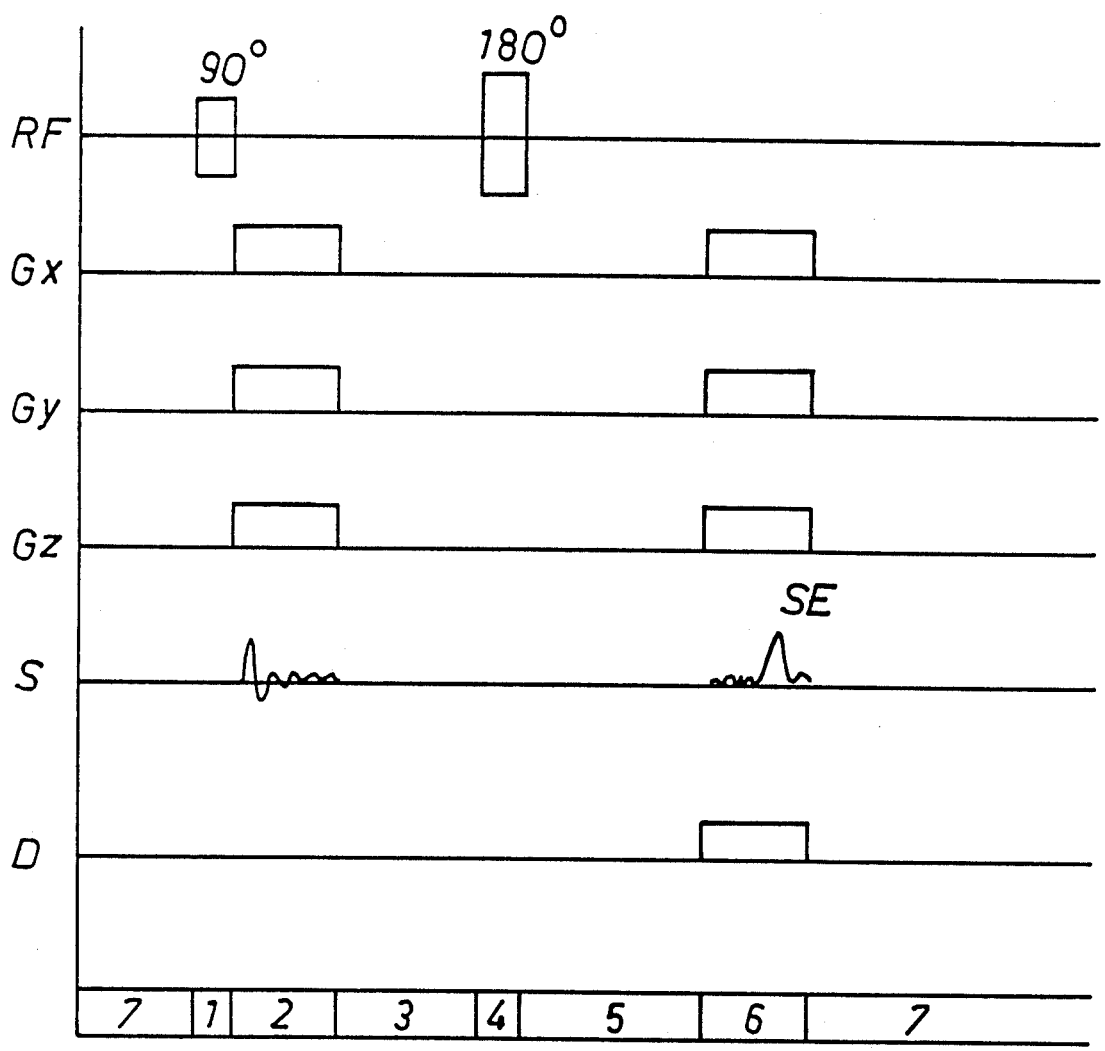
FIG. 1 shows one pulse sequence according to the invention for producing a final image by means of a so-called projection-reconstruction method, with so-called selective excitation being applied in excitation.
Figure 2:
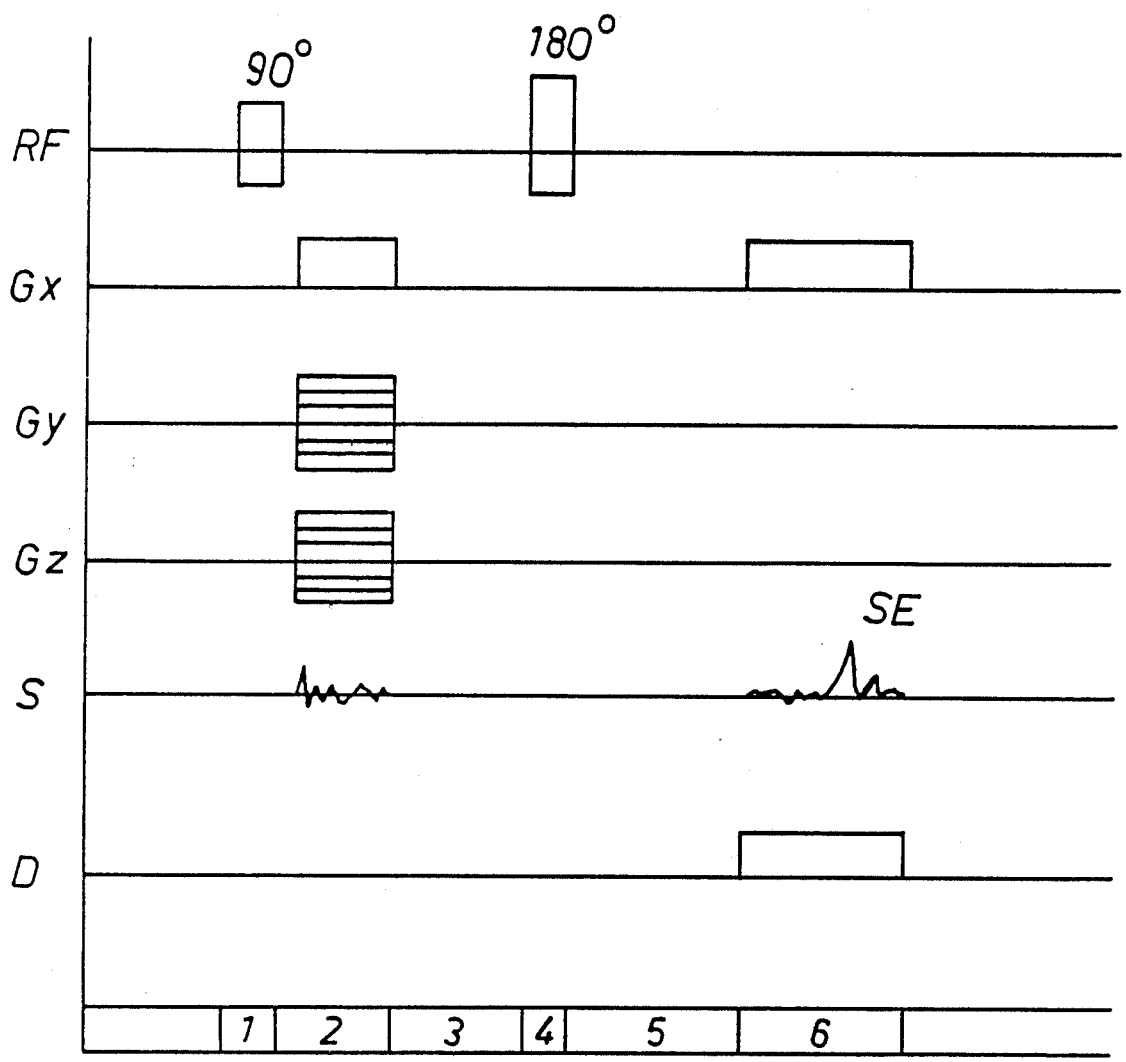
FIG. 2 shows one pulse sequence according to the invention for producing a final image by means of a so-called Fourier method.

At phase 1 in FIG. 1, an object area is subjected to an excitation pulse (a first excitation pulse) which tilts the nuclear magnetization preferably through 90°. This is followed by applying to the object area a magnetic field gradient that can be thought of being created as a resultant of three orthogonal gradient fields $G_x$, $G_y$ and $G_z$ (phase 2). Thereafter, the nuclear magnetization is affected during the delay $(-N_m/2+m)$ tau $1+n$TAU (phase 3) e.g. by the chemical shift and coupling constants. At phase 4, the object is subjected to a second excitation pulse which tilts the magnetization preferably through 180°. After this, the nuclear magnetization is again affected e.g. by the chemical shift and coupling constants during the delay $(N_m/2-m)$ tau $1+n$TAU (phase 5). At phase 6, a magnetic field gradient is again applied to the object area and the object. This gradient must have a component different from zero, said component being parallel to the gradient applied at phase 2. During phase 6, a generated spin echo SE is picked up preferably in a manner that the gradient time integral between successive sampling moments is constant. Axis D indicates the time of data collection. The above-described sequence is repeated after a certain delay (phase 7) for a sufficient number of times in order to obtain a desired positional resolution, a desired resolution in the direction of chemical spectrum or in $\delta$-direction and a desired resolution in the direction of coupling constant or in J-direction. In practice, the production of e.g. $N_x \times N_y \times N_z \times N_\delta \times N_J$ image requires $N_y N_z N_\delta N_J$ times of repetition. In order to produce an image, the direction of the resultant of said magnetic field gradient being applied at phase 6 must be first changed $N_y N_z$ times and this must be repeated by varying the value of m at phases 3 and 5 within the range of $0 \ldots N_\delta - 1$ and the above must be repeated by varying the value of n at phases 3 and 5 within the range of $0 \ldots N_J - 1$. This order of change can also be selected otherwise. FIG. 2 illustrates the application of the method in conjunction of so-called Fourier methods. In principle, the operation is exactly the same as that described in connection with FIG. 1 but, at phase 2, the time integrals of e.g. gradient pulses $G_y$ and $G_z$ are preferably changed at equal intervals when repeating the sequence and a final image is produced by means of a multi-dimensional Fourier variation. This can be illustrated by presenting signal SE picked up at phase 6 as follows:

$$SE \int_x \int_y \int_z \int_\delta \int_J A(x,y,z,\delta,J) \exp j (\Delta\phi_y k_y +$$

$$\Delta\phi_z l_z + (-N\delta m/2)\text{tau} l B_0 \delta \gamma + J2\pi n\text{TAU}) - \Delta\phi_x x + t'\gamma G_x x)$$

wherein

SE (k,l,m,n,t')=is at spin echo signal moment t' and at the time of repetition k,l,m,n k=/0 ... $N_y$−1/
l=/0 ... $N_z$−1/
m=/0 ... N−1/
n=/0 ... $N_J$−1/

$\phi y, \phi z, \phi x$=instability created with gradient pulses at phase 2 x,y,z=position coordinates
j=$\sqrt{-1}$
$\gamma$=gyromagnetic ratio
$B_o$=strength of polarized magnetic field
$A(x,y,z,\delta,J)$=nuclear density at x,y,z,$\delta$,J
$\delta$=chemical shift
J=coupling constant.

Figure 3:
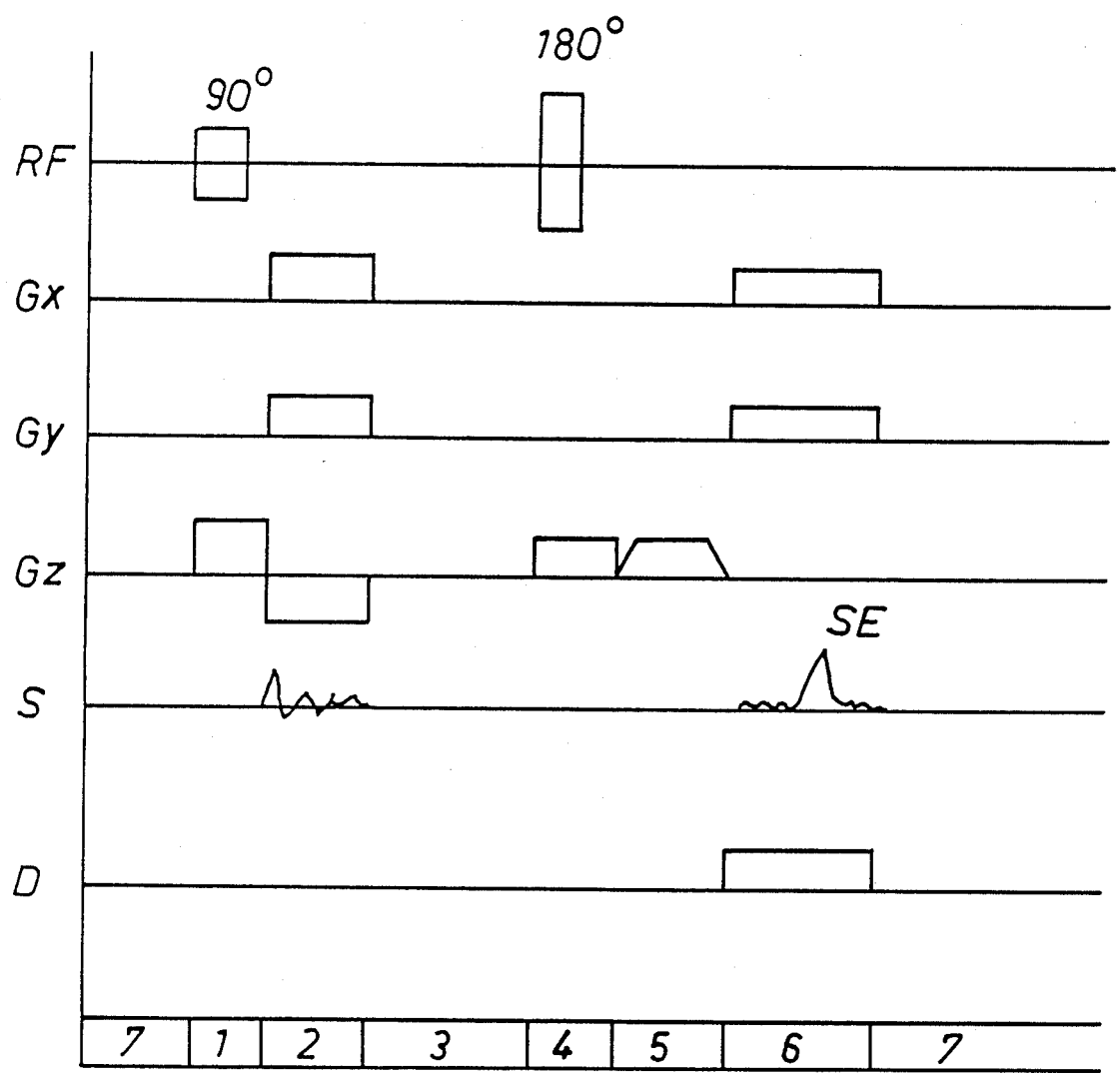
FIG. 3 shows one pulse sequence according to the invention for producing a final image by means of a so-called projection-reconstruction method, with so-called selective excitation being applied in excitation.
Figure 4:
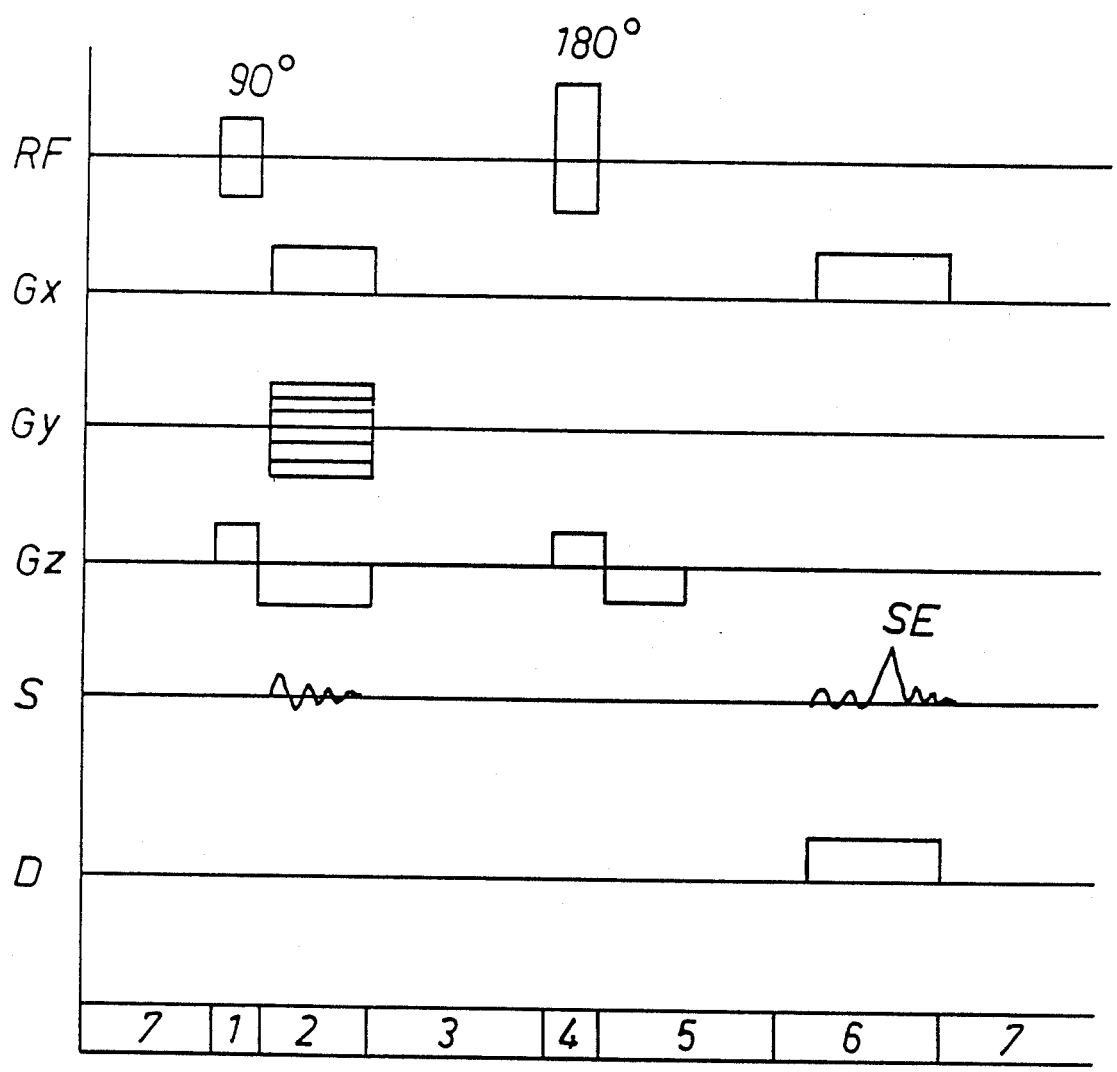
FIG. 4 shows one pulse sequence according to the invention for producing a final image by means of a so-called Fourier method, with so-called selective excitation being applied in excitation.

FIGS. 3 and 4 illustrate application of the method in connection with so-called selective excitation. Said first and second excitation pulses may both be selective or just one of them may be selective. In addition, the method can be applied on a so-called multi-slice principle, i.e. other areas or sections of an object are being excited during the recovey of the nuclear magnetization of sections subjected to preceding excitation pulses.

Figure 5:
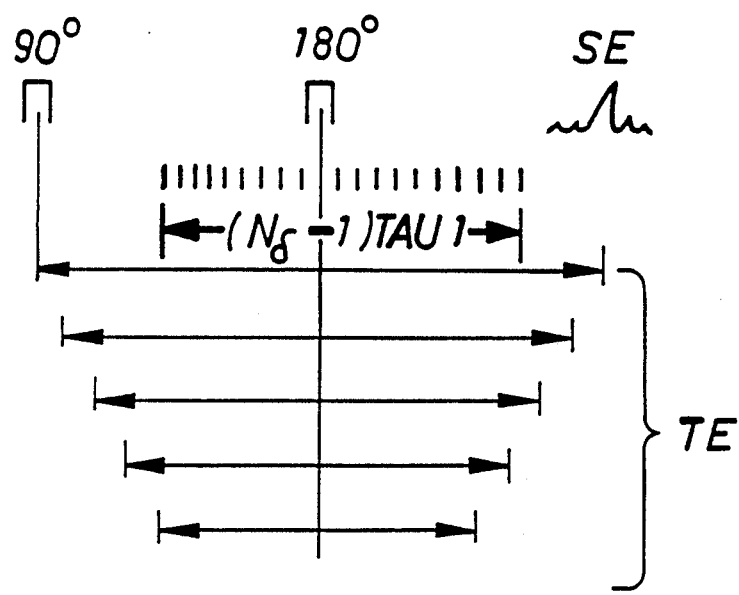
FIGS. 5A and 5B show a variation of the method of the invention for collecting only coupling constant information without spectral information, the Figs. showing the mutual timing relationships among the first excitation pulse, second excitation pulse, and produced spin echo.
Figure 5:
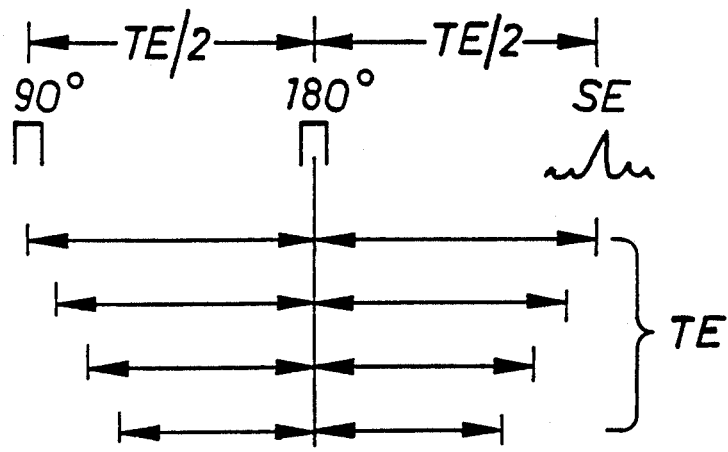

FIGS. 5A and 5B show a variation of the method of the invention for only collecting information related to coupling constants without spectral information. FIG. 5A illustrates a method of the invention by only presenting the mutual timing relations of a so-called first excitation pulse (90°), a second excitation pulse (180°) and a produced spin echo SE. For imaging the complete spectral information, the distance TE of said echo from the first excitation pulse is changed preferably at equal intervals a certain minimum value to a certain maximum value or vice versa. For each value of TE, the distance of the 180° or second excitation pulse from the first excitation pulse is changed, preferably at equal intervals, from a certain minimum value to a certain maximum value or vice versa. It is preferable to have the average of the minimum and maximum value of this change process correspond to the midway point of the TE-time at any particular moment. As for the method itself, the order of carrying out the above change processes is not significant. For the sake of clarity, the figure does not include the gradient sequences required by imaging methods. FIG. 5B illustrates a method of the invention for only providing information relating to coupling constants. In this case, TE is changed preferably at equal intervals from a certain minimum value to a certain maximum value or vice versa. In this case, in order to eliminate the effects of magnetic field inhomogeneities and chemical spectrum, it is preferable that said second excitation pulse (180°) be as accurately as possible at the midway point of the time or period between said first excitation pulse (90°) and spin echo SE. It is obvious that this variation can be applied in connection with so-called Fourier and projection-reconstruction methods.

It can be noted about the timing of sequences that the resolution of the method in the direction of chemical shift or in $\delta$-direction is inversely proportional to $2 \times N_\delta \text{tau 1}$ and in the direction of coupling constant or in J-direction inversely proportional to $2 \times N_J \text{TAU}$. As the coupling constants are of the order of 0 ... 200 Hz, the product $2 \times N_J \text{TAU}$ must be of the order of 1 ... 0.002 s.

The method can also be used to analyse the dynamic properties of an object. In the case of a human body, for example, the respiratory tracts, alimentary canal or blood circulation can be used to carry suitable ingredients that affect said coupling constant and use these as a kind of tracers for monitoring e.g. metabolism, blood circulation or the like. Such ingredients include: substances like fats, sugars, alcohols and other carbon compounds which participate in metabolism and in which the most common isotopes of e.g. hydrogen, carbon, nitrogen or oxygen are replaced with preferably stable isotopes of the same nucleus, e.g. with hydrogen deuterium $^{16}O^{17}O$ and $^{12}C^{13}C$. Other than the above carbon compounds are also conceivable. It is further possible to bind the above type of compounds to monoclonal antibodies which find their way e.g. to the remote nests of a malignant tumour. If necessary, an object are can thereafter be repeatedly mapped with the described method and then it is not necessary to always map the local distribution of spectrum for a considerably shorter imaging time.

The invention is not limited to the above embodiments.

I claim:

1. A method of mapping the local distribution of a coupling constant J of the nuclear magnetization of an object, said method utilizing a selected magnetic resonance imaging method and comprising the steps of:
exciting the object with a first radio frequency excitation pulse for altering the nuclear magnetization of the object;
applying a magnetic field gradient to the object;
exciting the object with a second radio frequency excitation pulse for altering the nuclear magnetization of the object, the object being subjected to said second pulse after a first delay time, as taken from said first pulse;
again applying a magnetic field gradient to the object;

obtaining a spin echo signal from said object, said spin echo being obtained after a second delay time, as taken from said second pulse; and repeating the above steps while changing said first and second delay times from first values to second values and changing the time integrals of the magnetic field gradients in accordance with the selected imaging method to generate a map of the local distribution of the coupling constant J.

2. A method as set forth in claim 1 further defined as changing the first and second delay times in constant increments.

3. A method as set forth in claim 1 wherein said first and second delay times are equal.

4. A method as set forth in claim 1 further defined as repeating the steps by first changing the time integrals and then changing the delay times.

5. A method as set forth in claim 1 further defined as changing said first and second delay times in a manner such that the first delay time is changed from a first minimum value to a first maximum value and the second delay time is changed by corresponding first maximum and minimum values in such a manner such that the sum of the first and second delay times is constant, and as changing the sum of the delay times from a second minimum value to a second maximum value while maintaining the difference between said first values of said first and second delay times constant.

6. A method as set forth in claim 5 further defined as first changing the sum of the first and second delay times and then changing the first and second delay times.

7. A method as set forth in claim 5 wherein the step of applying a magnetic field gradient is further defined as applying first, second, and third magnetic field gradients having desired values to the object and wherein the step of again applying magnetic field gradient is further defined as applying said first, second, and third magnetic field gradients at their desired values; and wherein said method is defined as containing the further steps performed in any desired order;

repeating the excitation by said first and second excitation pulses while changing the time integrals of said magnetic field gradients in accordance with the selected imaging method;

repeating the excitation by said first and second excitation pulses while changing said first delay time from a first minimum value to a first maximum value and while maintaining the sum of said first and second delay times constant; and repeating the excitation by said first and second pulses while changing the sum of said first and second delay times from a second minimum value to a second maximum value while maintaining the difference between said first values of said first and second delay times constant by changing said first values so as to maintain their average temporally symmetrical with respect to the first excitation pulse and said spin echo signal.

8. A method as set forth in claim 1 further defined as a method for determining the physiological properties of an object, such as metabolism, blood circulation, tumor location, and like properties, said method further including the step of supplying the object with a tracer means containing nuclei, the coupling constants of which are different from those normally present in the object, and as including the step of mapping the local distribution of the coupling constant to determine the physiological property of the object.

9. A method as in claim 8 further defined as supplying a tracer means containing a stable isotope of a nucleus which is normally present in nature in small amounts and having a different coupling constant than isotopes present in greater amounts.

* * * * *